US007754411B2

(12) United States Patent
Tutikawa et al.

(10) Patent No.: US 7,754,411 B2

(45) Date of Patent: Jul. 13, 2010

(54) SLIP SHEET FOR A PLANOGRAPHIC PRINTING PLATE, PRODUCTION PROCESS THEREOF AND A PROTECTED PLANOGRAPHIC PRINTING PLATE AND LAMINATE THEREOF

(75) Inventors: Keiiti Tutikawa, Numazu (JP); Katsuhiko Hidaka, Yokohama (JP); Masao Akamatsu, Odawara (JP); Takeshi Kaneda, Yokohama (JP)

(73) Assignee: Tokushu Paper Mfg. Co., Ltd., Shizuoka-Ken (JP)

( * ) Notice: Subject to any disclaimer, the term of this patent is extended or adjusted under 35 U.S.C. 154(b) by 68 days.

(21) Appl. No.: 10/505,792

(22) PCT Filed: Feb. 27, 2003

(86) PCT No.: PCT/JP03/02231

§ 371 (c)(1), (2), (4) Date: Aug. 25, 2004

(87) PCT Pub. No.: WO03/072877

PCT Pub. Date: Sep. 4, 2003

(65) Prior Publication Data

US 2006/0014102 A1 Jan. 19, 2006

(30) Foreign Application Priority Data

Feb. 27, 2002 (JP) ............................ 2002-052408
Jul. 30, 2002 (JP) ............................ 2002-221054

(51) Int. Cl.
*G03F 7/09* (2006.01)
*B22B 29/06* (2006.01)

(52) U.S. Cl. ............... 430/270.1; 428/537.5; 430/271.1

(58) Field of Classification Search ............. 430/270.1, 430/271.1, 300, 273.1, 302, 961; 156/537; 101/463.1; 428/537.5
See application file for complete search history.

(56) References Cited

U.S. PATENT DOCUMENTS 3,041,208 A 6/1962 Hay et al.
3,400,008 A 9/1968 Bleyle et al.
3,639,148 A 2/1972 Moore et al.
4,238,560 A * 12/1980 Nakamura et al. .......... 430/162
4,302,283 A * 11/1981 Blitzer et al. ............... 162/158
4,617,239 A * 10/1986 Maruyama et al. .......... 428/452
4,894,315 A * 1/1990 Feinberg et al. .......... 430/281.1
5,637,383 A * 6/1997 Sakurai et al. ........... 428/211.1
5,698,305 A 12/1997 Suzuki et al.
5,700,852 A * 12/1997 Iwanaga et al. ............. 523/201
5,853,542 A * 12/1998 Bottorff .................... 162/168.2
6,217,694 B1 * 4/2001 Taniguchi ................... 156/235
6,291,127 B1 * 9/2001 Dagan et al. ................ 430/201
6,342,689 B1 * 1/2002 Ishigaki et al. .............. 219/216
6,432,550 B1 * 8/2002 Ohbayashi et al. .......... 428/511
6,461,795 B1 10/2002 McCullough et al.
6,495,242 B1 * 12/2002 Tsuchiya et al. ......... 428/32.24
6,534,234 B1 * 3/2003 Naruse et al. ............... 430/162
6,706,462 B2 * 3/2004 Murota et al. ............ 430/273.1
6,727,044 B1 * 4/2004 Fujimaki et al. ......... 430/284.1
2001/0024731 A1 9/2001 Usui
2001/0033904 A1 10/2001 Usui et al.
2001/0036597 A1 * 11/2001 Usui ....................... 430/273.1
2002/0004179 A1 1/2002 Nishiyama
2002/0042021 A1 4/2002 Okano et al.
2002/0130943 A1 * 9/2002 Katoh et al. ................ 347/105
2002/0136979 A1 * 9/2002 Miyake et al. .............. 430/156
2003/0036019 A1 * 2/2003 Teng .......................... 430/302

FOREIGN PATENT DOCUMENTS

CA 1320839 3/1993
CN 1327176 A 12/2001
EP 0 950 514 10/1999
EP 1 132 199 A1 9/2001
EP 1 138 520 10/2001

(Continued)

OTHER PUBLICATIONS

XP-002359106, U. Adler, Memento De Technologie Automobile, Article, Aug. 19, 1988, p. 73, Robert Bosch GmbH, Stuttgart, Germany.

(Continued)

*Primary Examiner*—Cynthia H Kelly
*Assistant Examiner*—Anca Eoff
(74) *Attorney, Agent, or Firm*—RatnerPrestia

(57) ABSTRACT

The present invention provides a slip sheet that protects a planographic printing plate in which the coefficient of static friction between corresponding surfaces of the slip sheet that contact an image-forming surface of the planographic printing plate is 0.35 or less, the surface strength of the slip sheet is 15 or more, or the Clark stiffness of the slip sheet is 20 to 50. In a production process of the planographic printing plate, the image-forming surface and the slip sheet are adhered by suitably charging, and following their lamination, the charge rapidly dissipates resulting in favorable separation, discharge characteristics and storage characteristics in an automatic plate feeder. In addition, sticking between the slip sheet and the image-forming surface during heat treatment can also be prevented simultaneously. This slip sheet is particularly effective for planographic printing plates of the heat mode type and photon mode type on which images are formed by exposure to laser light.

22 Claims, 2 Drawing Sheets

FOREIGN PATENT DOCUMENTS

| | | | | |
|---|---|---|---|---|
| EP | 1 160 098 | A1 | | 12/2001 |
| JP | H05-239793 | | | 9/1993 |
| JP | 06-235193 | | * | 8/1994 |
| JP | H07-042092 | | | 2/1995 |
| JP | H07-216794 | | | 8/1995 |
| JP | 10-44633 | | | 2/1998 |
| JP | 10-197992 | | * | 7/1998 |
| JP | 10244751 | A | * | 9/1998 |
| JP | 10324734 | | | 12/1998 |
| JP | 2000-238450 | | | 9/2000 |
| JP | 2001022511 | | | 1/2001 |
| JP | 2001-125282 | | | 5/2001 |
| JP | 2001-133965 | | | 5/2001 |
| JP | 2001-199472 | | | 7/2001 |
| JP | 2001-246869 | | | 9/2001 |
| JP | 2001-281873 | | | 10/2001 |
| JP | 2001-296653 | | | 10/2001 |
| JP | 2001-34155 | | | 12/2001 |
| JP | 2002-59669 | | | 2/2002 |
| WO | WO 99/21715 | | | 5/1999 |
| WO | WO0029214 | | * | 5/2000 |

OTHER PUBLICATIONS

Paper and Board—Determination of surface strenght—Wax pick test method—Japan TAPPI Paper pulp test method No. 12000.

Testing method for surface strength of paper and paperboard—Japanese Industrial Standard (JIS) P8129.

K. Isamu and M. Jin, A Study of the Stiffness and "Koshi" of Paper, *Journal of the Japanese Technical Association of Pulp and Paper Industry*, 17(4), 19-26, Sho. 38.

T. Nomura, Mix well with printing paper, pp. 90-93, 1993.

Japanese Patent Office Communication regarding Japanese Application No. JP-2008-235604 mailed Mar. 2, 2010.

* cited by examiner

SLIP SHEET FOR A PLANOGRAPHIC PRINTING PLATE, PRODUCTION PROCESS THEREOF AND A PROTECTED PLANOGRAPHIC PRINTING PLATE AND LAMINATE THEREOF

This application is a U.S. national phase application of PCT International phase application No. PCT/JP03/02231 filed Feb. 27, 2003, claiming priority to Japanese application No. 2002-052408 filed Feb. 27, 2002, and Japanese application No. 2002-221054 filed Jul. 30, 2002.

TECHNICAL FIELD

The present invention relates to a slip sheet for a planographic printing plate. More particularly, the present invention relates to a slip sheet for protecting an image-forming surface formed on a support such as an aluminum plate on which images are formed by exposing to laser light, ultraviolet rays, infrared rays and so forth, a production process of this slip sheet, a planographic printing plate that uses this slip sheet, and a laminate thereof.

BACKGROUND ART

In the past, planographic printing plates like PS plates had been contacted with a sheet referred to as a slip sheet and wound into the shape of a coil or cut to a desired size and deposited to protect an image-forming surface layer (image-forming surface) by performing surface treatment such as pebbling, anodic oxidation, silicate treatment or other chemical treatment on a support such as an aluminum plate either formed into the shape a coil or a sheet independently or in a suitable combination followed by coating an image-forming coating material on the surface to form an image-forming layer. A method in which the slip sheet is charged was typically employed in the process for adhering this slip sheet to the image-forming surface of a planographic printing plate.

The amount of the charge for charging the slip sheet is required to be a suitable value for satisfactory paper discharging characteristics in a plate setter and so forth that contains an automatic plate feeder. For example, if the amount of the charge is too small, problems in the form of the occurrence of misalignment and separation occur in the image-forming surface in the production process of the planographic printing plate. In addition, if the charge is too large, due to the excessively high adhesion between the slip sheet and the image-forming surface, problems occur in the slip sheet separation and paper discharge steps in a plate setter that contains an automatic plate feeder as previously mentioned.

FIGS. 1A and 1B are schematic drawings of the production process of a planographic printing plate. FIG. 1A is a drawing of a step in which the slip sheet is adhered and cut, while FIG. 1B is an enlarged schematic drawing of a laminate of a layered planographic printing plate following cutting. In FIGS. 1A and 1B, reference symbol (1) indicates the slip sheet, (2) indicates an image-forming surface of a planographic printing plate, (3) indicates a support surface of a planographic printing plate, (4) indicates the surface of the slip sheet, (5) indicates a charging device, (5') indicates a charging roll, (6) indicates a rotary cutter, (7) indicates a transport belt conveyor, (8) indicates a laminate of the planographic printing plate and slip sheet, (9) indicates a resin pallet, and (10 indicates a planographic printing plate.

FIG. 2 is shown a schematic drawing of an automatic plate feeder for planographic printing plates. In FIG. 2, reference symbol (11) indicates a suction member for planographic printing plates, (13) indicates a suction member for slip sheet discharge, (14) indicates rolls for slip sheet discharge, (15) indicates a slip sheet discharge storage box, and (16) indicates the stored slip sheets, while other reference symbols have the same meanings as those indicated in FIG. 1A or 1B.

A process for preventing the aforementioned problems by using a slip sheet in which the volume resistivity value is adjusted to a certain value is disclosed in Japanese Unexamined Patent Application, First Publication No. 10-197992 as a countermeasure for these problems. However, in the case of fluctuations in the line speed or environment of the production process, it is difficult to control the amount of charge to a constant amount, thereby making this inadequate. In addition, although a process for controlling the amount of charge to a constant level by measuring the surface electrical potential of a slip sheet is disclosed in Japanese Unexamined Patent Application, First Publication No. 2001-22511, this process had the problems of complex production equipment and high costs.

In addition, in recent platemaking processes for planographic printing plates such as PS plates, the flow of the platemaking work is being reconfigured from platemaking processes involving adhesion and exposure using a film as in the prior art to the sophisticated digital processing of data and the development of high-output lasers for recording that data, and the parallel development of accompanying intensifiers, resulting in the rapid proliferation of computer-to-plate (CTP) systems in which a camera-ready copy produced with a computer is exposed and developed directly on the planographic printing plate without having to go through the stage of a film copy. Accompanying these technological advances, automation of the platemaking process has proceeded rapidly for the purpose of improving the efficiency of platemaking work. A water-soluble oxygen-blocking layer is formed in these CTP-based planographic printing plates, and in planographic printing plates accompanied by a laser-reactive heat-sensitive layer on the image-forming surface in particular. When the number of laminated layers is increased in the production process since this layer is soft and since the surface is softened by moisture and so forth, a blocking phenomenon occurs between the image-forming surface of slip sheet, thereby resulting in the problem of increased susceptibility to sticking.

Moreover, in planographic printing plate accompanied by a heat-sensitive layer as described above, as is disclosed in Japanese Unexamined Patent Application, First Publication No. 10-324734 and Japanese Unexamined International Patent Publication No. 2001-520953, heat treatment (aging) may be performed after coating and drying an image-forming coating material onto a support, and at this time, the image-forming surface softens due to the temperature of the heat treatment, thereby resulting in the surface of the slip sheet sticking to the image-forming surface and damage to the surface of the image-forming surface when the slip sheet is separated. Although a slip sheet having satisfactory separation has been used to solve this problem, in which polyethylene is laminated to the surface of the slip sheet that contacts the image-forming surface of the planographic printing plate, the surface of this polyethylene layer is easily charged, and has the property of difficulty in dissipating the charge once it has become charged, thereby resulting in problems with separation of the slip sheet in a plate setter and so forth that contains an automatic plate feeder as previously mentioned.

Moreover, although the slip sheet discharged with a plotter is temporarily housed in a box for discarding, with respect to the storage characteristics of the slip paper in the discard box, it is preferable that the slip sheet be housed in the box while being folded in an orderly manner to facilitate efficient storage.

DISCLOSURE OF THE INVENTION

In order to solve the aforementioned problems, an object of the present invention is to provide a slip sheet that offers the following advantages which is used in the production process of planographic printing plates on which images are formed by exposing to laser light in particular.

(1) The image-forming surface and slip sheet can be adhered by suitably charging in a production process of a planographic printing plate.

(2) The slip sheet adhered to the image-forming surface can be easily separated during lamination of the planographic printing plate.

(3) The slip sheet is effective for heat treatment (aging) of the image-forming surface.

(4) The slip sheet can be easily discharged from a plotter.

(5) The slip sheet can be orderly stored in a discard storage box.

As a result of conducting extensive studies to solve the aforementioned problems, the inventors of the present invention found that adhesion, separation, aging characteristics, discharge and storage problems can be resolved in the proper balance by using a novel slip sheet having specific parameters, thereby leading to completion of the present invention.

Namely, a first aspect of the present invention relates to a slip sheet for a planographic printing plate that protects the planographic printing plate by having a surface that contacts an image-forming surface of the planographic printing plate, wherein the coefficient of static friction between the surfaces is 0.35 or less. Here, the coefficient of static friction is measured for sheets flowing in the same direction based on the horizontal method of JIS-P8147.

In addition, a second aspect of the present invention relates to a slip sheet for a planographic printing plate that protects the planographic printing plate by having a surface that contacts an image-forming surface of the planographic printing plate, wherein the surface strength of the surface is 15 or more. Here, the surface strength is measured based on Method A described in Paper Pulp Test Method No. 1 of Japan TAPPI standards.

In addition, a third aspect of the present invention relates to a slip sheet for a planographic printing plate that protects the planographic printing plate by having a surface that contacts an image-forming surface of the planographic printing plate, wherein the Clark stiffness is from 20 to 50. Here, Clark stiffness is measured based on JIS-P8143 using a test piece having a width of 15 mm.

In addition, a fourth aspect of the present invention relates to a production process of a slip sheet for a planographic printing plate comprising a step in which a surface treatment agent containing an alkenyl dicarboxylic acid or derivative thereof and, as necessary, an acrylic polymer, is coated onto the surface of paper.

In addition, a fifth aspect of the present invention relates to a production process of a slip sheet for a planographic printing plate comprising a step in which a paper raw material containing an alkenyl dicarboxylic acid or derivative thereof and, as necessary, an acrylic polymer, is made into paper.

In the production process of a slip sheet for a planographic printing plate of the aforementioned fifth aspect, a surface treatment agent containing an alkenyl dicarboxylic acid or derivative thereof and, as necessary, an acrylic polymer may be coated onto the surface of the paper obtained in the aforementioned papermaking step.

In addition, a sixth aspect of the present invention relates to a protected planographic printing plate comprising a planographic printing plate having an image-forming surface and the aforementioned slip sheet of the present invention, the surface of which is in contact with the image-forming surface.

In addition, a seventh aspect of the present invention relates to a laminate of a planographic printing plate comprised by mutually laminating the aforementioned slip sheet of the present invention and a planographic printing plate.

BRIEF DESCRIPTION OF THE DRAWINGS

FIG. 1A is a drawing of a step in which the slip sheet is adhered and cut, while FIG. 1B is an enlarged schematic drawing of a laminate of a layered planographic printing plate following cutting.

BEST MODE FOR CARRYING OUT THE INVENTION

Figure 1A:
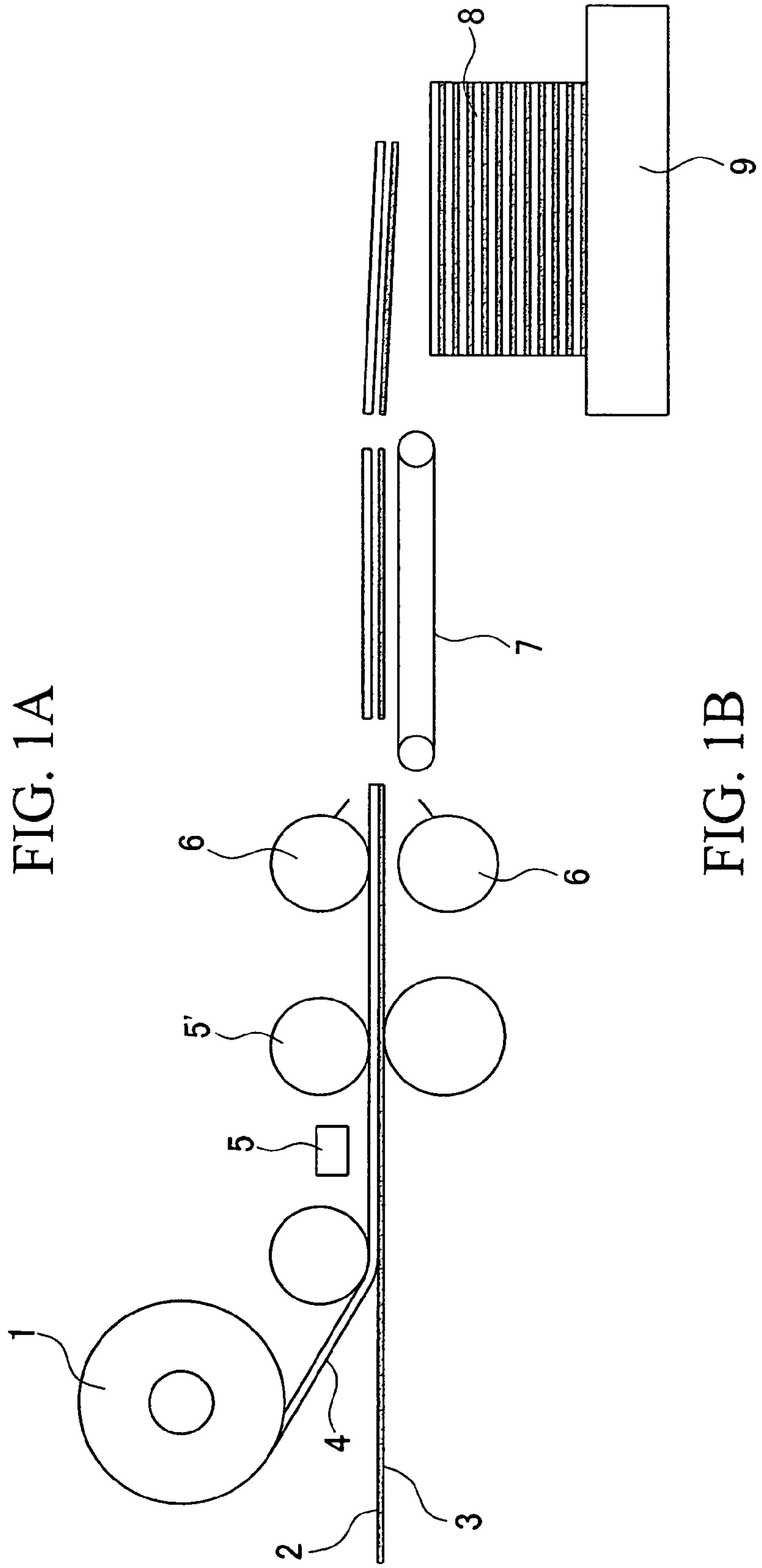
FIGS. 1A and 1B are schematic drawings of the production process of a planographic printing plate.

The following provides a detailed explanation of the present invention. First, an explanation is provided of I: Slip Sheet Characteristics (Specific Parameters), and this is followed by an explanation of II: Overall Production of Planographic Printing Plate.

I: Slip Sheet Characteristics (Specific Parameters)

(1) Slip Sheet Coefficient of Friction

The surface of the slip sheet that contacts the image-forming surface of the planographic printing plate is referred to as the "slip sheet top surface", while the surface that does not contact the image-forming surface is referred to as the "slip sheet back surface". The coefficient of static friction between corresponding slip sheet top surfaces is 0.35 or less, preferably 0.30 or less and more preferably 0.27 or less. The lower limit of the coefficient of static friction is about 0.10. In addition to the coefficient of static friction between corresponding slip sheet top surfaces being 0.35 or less, the coefficient of dynamic friction between corresponding slip sheet top surfaces is more preferably 0.32 or less. If outside the aforementioned range, a proper balance of adhesion and separation characteristics may not be able to be achieved between the image-forming layer of the planographic printing plate and the slip sheet.

The coefficient of dynamic friction of the surface where the slip sheet top surface contacts the image-forming surface of the planographic printing plate is 0.27 or less, preferably 0.25 or less and more preferably 0.23 or less. The lower limit of the coefficient of dynamic friction is about 0.10. If outside the aforementioned range, a proper balance of adhesion and separation characteristics may not be able to be achieved between the image-forming layer of the planographic printing plate and the slip sheet.

The slip sheet back surface contacts the support without contacting the image-forming surface of the planographic printing plate. In the case of storing a planographic printing plate provided with a slip sheet in the form of a laminate, the coefficient of friction of this back surface becomes an important factor. The coefficient of static friction between the slip sheet top surface and back surface is preferably 0.32 or less and more preferably 0.30 or less.

In consideration of the stiffness, characteristic fiber length and so forth of the fibers used, examples of methods for adjusting the coefficient of friction within a desired range include selecting the pulp fiber material, adjusting the degree of beating using a refiner that has an effect on pulp length, suitably selecting the types, amounts used and usage methods, etc. of chemicals and fillers added into or coated onto the slip sheet, and adjusting the moisture content, smoothness, surface roughness and so forth of the slip sheet itself.

Furthermore, the coefficient of friction was measured for sheets flowing in the same direction (referring to the direction of flow of the papermaking line, and also referred to as the vertical direction) based on the horizontal method of JIS-P8147 (1994). During measurement, the samples were used after pretreating for at least 4 hours at a temperature of 23° C. and relative humidity of 50% in accordance with JIS-P8111 (1998).

(2) Slip Sheet Surface Strength

The surface strength of the slip sheet is 15 or more, preferably 16 or more and more preferably 18 or more. The upper limit is about 26. If the surface strength of the slip sheet is lower than the aforementioned values, sticking occurs due to blocking between the image-forming layer of the planographic printing plate and the slip sheet during heat treatment (aging) of the laminate of the planographic printing plate and slip sheet.

Examples of methods for adjusting the surface strength of the slip sheet within a desired range include coating the surface of the sheet with a wax, surface treatment agent or release agent and so forth using a size press roll, smoother roll, roll coater, gravure coater or gate roll coater and so forth, and a method in which wax and so forth is added internally to the paper raw material during paper production. Paper produced using the internal addition method may also be additionally coated. Coating can be carried out in a single step or multiple steps. A multi-step method in which the sheet is allowed to dry after coating followed by additionally coating the same or different surface treatment agent and so forth is preferable. The reason for this is that effects are considered to be enhanced due to the presence of these surface treatment agents at higher concentrations on slip sheet top surface.

Furthermore, surface strength was measured based on Method A described in Paper Pulp Test Method No. 1 (2000) of Japan TAPPI standards. During measurement, the samples were used after pretreating for at least 4 hours at a temperature of 23° C. and relative humidity of 50% in accordance with JIS-P8111 (1998).

(3) Slip Sheet Clark Stiffness

The Clark stiffness of the slip sheet that contacts the image-forming surface of the planographic printing plate is 20 to 50 and preferably 21 to 35. If less than the aforementioned range, difficulties occur during discharge of the slip sheet from an automatic plate feeder, while if greater than the aforementioned range, problems occur in storage of the discharged slip sheet.

Examples of methods for adjusting the Clark stiffness to a desired range include methods for suitably setting the thickness, weight and density, as well as adjusting the moisture content of the slip sheet, suitably selecting the type of pulp fiber, suitably selecting the beating conditions, and suitably selecting the types, amounts used, usage methods and so forth of chemicals used.

Furthermore, Clark stiffness was measured using a Clark stiffness tester based on JIS-P8143 (1996), and the average of three measurements was determined using a sample width of 15 mm. During measurement, the samples were used after pretreating for at least 4 hours at a temperature of 23° C. and relative humidity of 50% in accordance with JIS-P8111 (1998).

(4) Slip Sheet Surface Resistance

The surface resistance value of the slip sheet on the side that contacts the image-forming surface of the planographic printing plate is $1.0\times10^{7}$ to $1.0\times10^{12}$ Ω, and preferably $1.0\times10^{8}$ to $8.0\times10^{11}$ Ω. If less than the aforementioned range, adhesion between the slip sheet and photosensitive layer due to the charging device reduce in the production process of the planographic printing plate, while if greater than the aforementioned range, difficulties occur in separation of the slip sheet in the automatic plate feeder.

Although examples of methods for adjusting the surface resistance value to a desired range include methods using an anionic surfactant, cationic surfactant, nonionic surfactant, sodium chloride, salt cake or other inorganic electrolyte, electron conducting agent, ion conducting agent or water retention material, methods using adjustment of moisture content or a water retention material are examples of effective methods that are the least expensive. A moisture retention material can also be suitably used in combination with the aforementioned surfactants or conducting agents as necessary.

Furthermore, surface resistance value was measured by taking the average of three measurements based on JIS-K6911 (1979). During measurement, the samples were used after pretreating for at least 4 hours at a temperature of 23° C. and relative humidity of 50% in accordance with JIS-P8111 (1998).

(5) Slip Sheet Beck's Smoothness

Beck's smoothness of the slip sheet on the side that contacts the image-forming surface of the planographic printing plate is a parameter that is related to blocking between the slip sheet and the photosensitive layer during heat treatment (aging) of a positive photosensitive planographic printing plate in the same manner as surface strength, and in terms of improving the phenomenon of local sticking to the image-forming layer of the planographic printing plate by surface irregularities in the slip sheet during heat treatment (aging) of a laminate of the planographic printing plate and slip sheet, should have a value of 30 seconds or more, preferably 60 seconds or more, and more preferably 90 seconds or more. If the value is less than 30 seconds, surface irregularities become large and sticking tends to occur to the image-forming layer of the planographic printing sheet.

In addition, Beck's smoothness is also a parameter involved in overlapping prevention characteristics for preventing extra planographic printing plates from overlapping and being removed with the slip sheet when a planographic printing plate (10) in a laminate (8) is suctioned and lifted up with a planographic printing plate suction member (11) from the back surface in an automatic plate feeder. From the viewpoint of preventing this overlapping, the Beck's smoothness is preferably from 20 to 60 seconds and more preferably from 25 to 45 seconds.

The actual Beck's smoothness should be set to a suitable value while taking into consideration the proper balance between the aforementioned blocking characteristics (sticking to the image-forming layer of the planographic printing plate by surface irregularities in the slip sheet top surface) and overlapping characteristics.

Examples of methods for adjusting Beck's smoothness to a desired range include adjusting the material and production conditions in the manner of suitably selecting the type of fiber material and beating conditions for the raw material, suitably selecting the filler during internal addition and coating, and suitably selecting the types, amounts used and usage methods of chemicals used. In addition, Beck's smoothness can also be by simply improving the surface conditions during the paper production process by performing surface treatment using an on-machine calender or off-machine super calender, and these are suitably used as necessary.

Furthermore, Beck's smoothness was measured based on JIS-8119 (1998). During measurement, the samples were used after pretreating for at least 4 hours at a temperature of 23° C. and relative humidity of 50% in accordance with JIS-P8111 (1998).

(6) Slip Sheet Moisture Content

The moisture content of the slip sheet is 1 to 10% by weight and preferably 2 to 7% by weight. If less than the aforementioned range, static electricity is generated easily, and in the case of a positive photosensitive layer requiring heat treatment, replenishment of moisture during heat treatment is insufficient, and as a result, difficulties occur in forming an alkaline-resistant layer. Namely, aging effects resulting from heat treatment are not adequately demonstrated. On the other hand, if the aforementioned range is exceeded, problems occur with the storage characteristics and so forth of the photosensitive layer.

Methods for adjusting the moisture content within a desired range include adjusting the dryer conditions in the process of papermaking and the operating speed, thickness and basis weight of the papermaking machine, and adjusting the moisture content by adding moisture later using a seasoning machine.

Furthermore, moisture content was measured according to the method that uses a dryer based on JIS-P8127 (1998).

(7) Slip Sheet Basis Weight

The basis weight of the slip sheet is 20 to 120 g/m$^2$ and preferably 40 to 60 g/m$^2$. If it is less than 20 g/m$^2$, the slip sheet becomes excessively thin thereby preventing mechanical strength from being maintained. If the basis weight exceeds 120 g/m$^2$, the slip sheet becomes excessively thick, which together with being uneconomical, causes the laminate of the planographic printing plate and slip sheet to become excessively thick, which is disadvantageous in terms of workability. In addition, there is also the problem of being unable to ensure an adequate stored amount in the plate feeding cassette in an automatic plate feeder.

II: Overall Production of Planographic Printing Plate

The following provides a detailed explanation of the overall production of the planographic printing plate of the present invention. First, FIG. 1A, which was explained in the section on the Background Art, is a schematic drawing showing an example of the production process of a planographic printing plate, and this process can be directly applied to the present invention as well. The following provides a description of the production process (and particularly the slip sheet adhesion step) by citing the reference symbols in the drawing.

After an image-forming coating material capable of forming images by exposing to laser light is coated onto a support and dried, a slip sheet (1) is contacted with an image-forming surface (2), and the slip sheet top surface (1) is charged by passing through a charging device (5) and then adhered to image-forming surface (2) using static electricity while being pressed with charging roll (5').

Figure 1B:
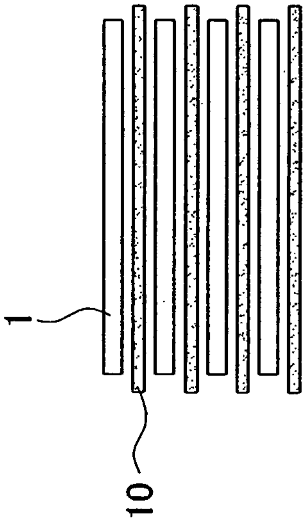

After cutting a planographic printing plate (10) and slip sheet (1) adhered thereto to a predetermined size with a rotary cutter (6) or shearing machine, they are transported by a belt conveyor (7) and so forth and the slip sheet and planographic printing plate are alternately laminated. The resulting laminate (8) is stored on a resin pallet (9) that is transported to the next step such as aging. FIG. 1B is a partially enlarged view of laminate (8).

Depending on the type of photosensitive layer, image-forming surface (2) can be stabilized or its performance can be improved by performing aging of laminate (8) by heating for a predetermined amount of time. The temperature during aging is 40 to 80° C. and preferably 50 to 60° C., and the aging time is maintained for 8 to 40 hours and preferably 16 to 39 hours. Furthermore, aging maybe carried out using hot air from a dryer and so forth, or by heating in a temperature-controlled atmosphere using a typical heating device such as an infrared heating device or microwave heating device. This aging is particularly effective for a heat mode type or photon mode type of image-forming layer using exposure to laser light to be described in detail hereinafter.

A device employing a corona discharge system is typically used for the charging device that charges slip sheet (1). The distance between the electrode for generating a corona discharge and the slip sheet (1) that receives the corona discharge is 3 to 70 cm, and the voltage applied at that time is preferably about −5 to −50 kV. In addition, the number of deposited sheets in planographic printing plate and slip sheet laminate (8) is preferably about 100 to 2000.

In order to have both the properties of ensuring adhesion with the image-forming layer and ensuring separation in the automatic plate feeder, the surface resistance value of the slip sheet in the present invention is $1.0\times10^7$ to $1.0\times10^{12}$ Ω, and preferably $1.0\times10^8$ to $8.0\times10^{11}$ Ω. However, even if the surface resistance value is adjusted to be within this range, proper adhesion and separation characteristics between the image-forming layer and slip sheet as described above may not be able to be realized due to problems such as recharging and so forth attributable to the atmosphere in the production process, fluctuations in the moisture content of the slip sheet, differences in charging characteristics of the image-forming layer, and slippage between the image-forming section and slip sheet during transport or similar slippage in the automatic plate feeder.

As a result of conducting extensive studies to resolve these problems, the inventors of the present invention found that separation between the image-forming layer of the planographic plating plate and the slip sheet can be stabilized such that, for example, the image-forming layer of the planographic printing plate and the slip sheet separate with stability in an automatic plate feeder and so on even if the amount of the charge in the slip sheet deviates from a predetermined range, by making the coefficient of static friction between corresponding surfaces of the slip sheet 0.35 or less and preferably 0.30 or less, and by making the coefficient of dynamic friction of the surface where the image-forming surface of the planographic printing plate and the slip sheet top surface make contact 0.27 or less, preferably 0.25 or less and more preferably 0.23 or less.

In addition, in order to prevent sticking caused by blocking between the image-forming layer of the planographic printing sheet and the slip sheet during aging of the planographic printing plate and slip sheet laminate by heat treatment, effects can be enhanced by making the surface strength of the slip sheet 15 or more, preferably 16 or more and more preferably 18 or more, while making Beck's smoothness 30 seconds or more, preferably 60 seconds or more and more preferably 90 seconds or more.

Figure 2:
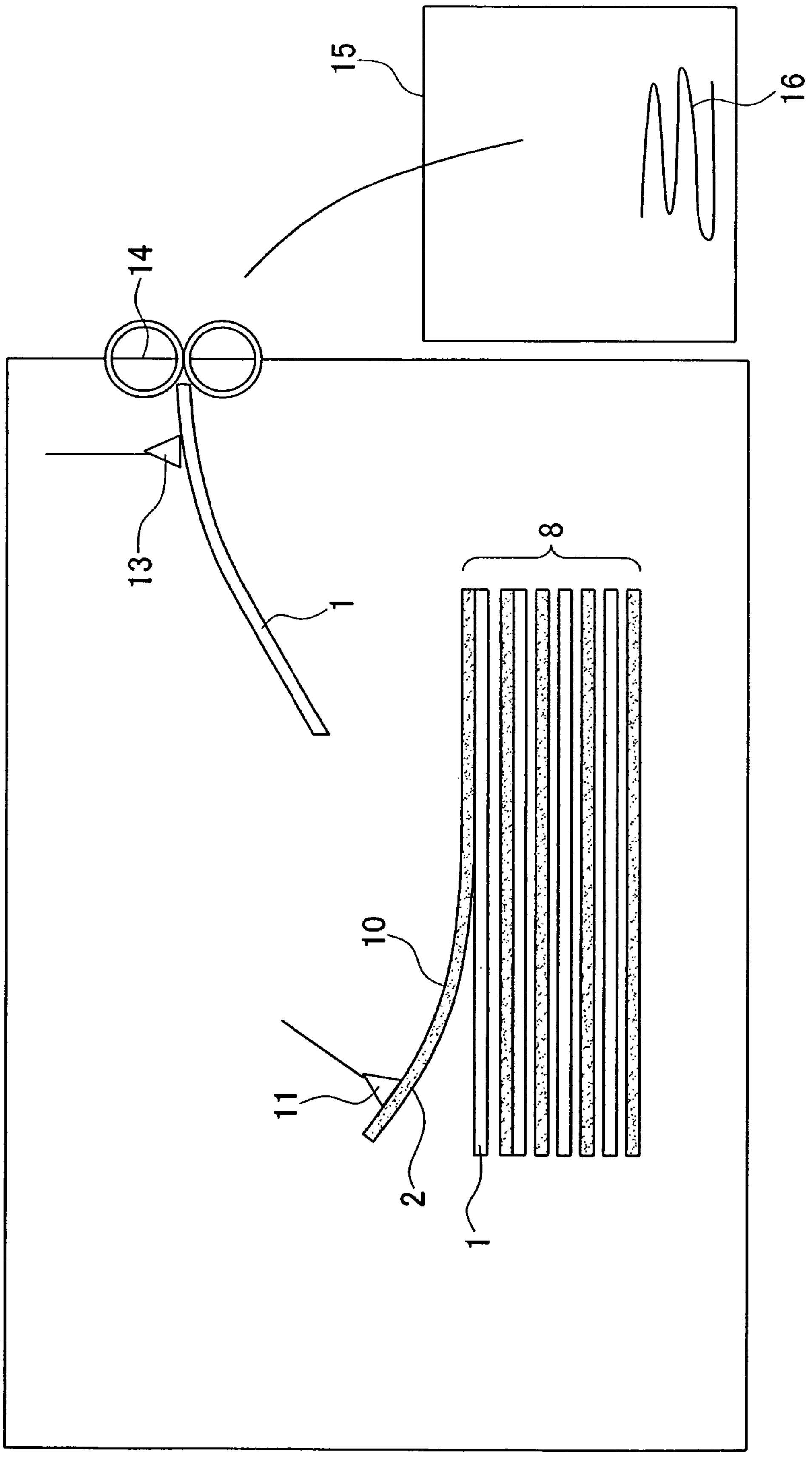
FIG. 2 is a schematic drawing of an automatic plate feeder for planographic printing plates.

Next, an explanation is provided of the discharge of the slip sheet in an automatic plate feeder and its characteristics when stored in a storage box. FIG. 2 is a schematic drawing of a typical automatic plate feeder used in a plate setter. Although planographic printing plate (10) within laminate (8) is lifted up by being suctioned with planographic printing plate suction member (11) from the back surface, it is necessary that slip sheet (1) easily separate from image-forming layer (2) of the planographic printing plate at this time. The planographic printing plate from which the slip sheet has separated is carried out to a platemaking step (not shown).

Next, slip sheet (1) that has been separated from planographic printing plate (10) is suctioned by slip sheet discharge suction member (13) and transported by slip sheet discharge rolls (14). At this time, if the stiffness of slip sheet (1) is too weak, the edge of slip sheet (1) becomes bent by slip sheet discharge rolls (14) preventing it from entering slip sheet discharge rolls (14). In addition, if the stiffness is too strong, slip sheet (1) cannot be stored folded as indicated by reference symbol (16) of FIG. 2 during storage of the slip sheet discharged into slip sheet discharge storage box (15), thereby decreasing the amount of slip sheet that can be stored. In order to prevent this, by making the Clark stiffness 20 to 50 and preferably 25 to 30, the discharge characteristics of slip sheet (1) as well as the slip sheet storage characteristics in slip sheet discharge storage box (15) can be improved.

Any slip sheet can be used for the slip sheet used in the present invention provided it is in the form of a sheet that has the property of being able to retain and contain moisture. Specific examples of slip sheets that can be applied in the present invention include wood pulp such as needle bleached kraft pulp (NBKP), leaf bleached kraft pulp (LBKP) and needle bleached sulfite pulp (NBSP), paper comprised of non-wood fibers such as hemp, flax, paper mulberry, mitsumata, bamboo, straw, kenaf, esparto, cotton rag or linter either alone or in a suitable combination, mixed paper of synthetic fibers such as polyethylene, polypropylene, nylon, polyester, rayon or tetron, semi-synthetic fibers and natural pulp, or synthetic paper, porous processed sponge-like synthetic resin sheets, foam sheets of synthetic rubber and natural rubber or slip sheets having a laminate structure suitably combining two or more types thereof.

In addition, although there are no particular limitations on the image-forming layer of the planographic printing plate in the present invention, there are cases in which heat treatment (aging) is performed on the image-forming layer depending on the particular type. At the time of this heat treatment, the surface of the image-forming layer softens resulting in susceptibility to blocking with the slip sheet. Consequently, the image-forming surface may be damaged if separated using excessive force. In order to prevent this, it is necessary to control the surface resistance value, amount of charge, Clark's stiffness, smoothness and surface strength of the slip sheet as previously described, which in turn regulates the separation strength between the image-forming layer and slip sheet. The inventors of the present invention found that this can be controlled by using a surface treatment agent in the slip sheet for preventing blocking between the image-forming layer and the slip sheet.

This surface treatment agent can be added internally, coated onto the surface using a size press roll, smoother roll, roll coater, gravure coater or gate roll coater and so forth, or both can be used.

Although a wax, surfactant such as metallic soap or a silicon-based or fluorine-based compound can be used alone or in combination for the surface treatment agent, that which does not have an effect on the image characteristics of the image-forming surface or have a detrimental effect on printing performance is preferable.

As a result of studies conducted by the inventors of the present invention, the use of an alkenyl dicarboxylic acid or derivative thereof, and particularly a saponification product, was observed to offer remarkable target effects for preventing blocking between the image-forming surface and the slip sheet. In addition, a mixture of this alkenyl dicarboxylic acid or a derivative thereof and an acrylic polymer (to be referred to as an acrylic resin) was found to have both blocking effects attributable to the alkenyl dicarboxylic acid or derivative thereof and effects that improve surface strength attributable to the acrylic resin.

Examples of derivatives of alkenyl dicarboxylic acid include alkenyl dicarboxylic anhydrides and their saponification products. For example, an alkaline saponification product of succinic anhydride having an alkenyl group having 3 to 20 carbon atoms is effective. In addition, examples of acrylic resins include polymers or copolymers of (meth)acrylic acid, (meth)acrylic esters and (meth)acrylic amides.

In addition, since blocking preventive effects between the image-forming surface and slip sheet are observed and discharge characteristics during discharge of the slip sheet from an automatic plate feeder are satisfactory even in the case a copolymer of a carboxylic ester and silicon such as styrene methacrylic ester-silicon copolymer or an emulsion comprised of a cationic polymer such as a cationic polyethylene emulsion is used in addition to the aforementioned surface treatment agent, these are also preferable surface treatment agents.

As was previously described, the moisture content of the slip sheet is 1 to 10% by weight and preferably 2 to 7% by weight, while the basis weight is 20 to 120 $g/m^2$ and preferably 40 to 60 $g/m^2$. Although these characteristic parameters and the ranges of their values are themselves known matters, they have important technical significance when combined with other characteristics.

There are no particular limitations on the image-forming layer (including the photosensitive layer and the thermosensitive layer) of the planographic printing plate in the present invention. The following embodiments (1) through (11) are examples of the image-forming layer.

(1) Embodiment in which the photosensitive layer contains an infrared absorber, a compound that generates acid when heated and a compound that is crosslinked by acid.

(2) Embodiment in which the photosensitive layer contains an infrared absorber and a compound that becomes alkaline-soluble when heated.

(3) Embodiment in which the photosensitive layer contains two layers consisting of a layer that contains a compound that generates radicals when irradiated with laser light, an alkaline-soluble binder and a multifunctional monomer or pre-polymer, and an oxygen blocking layer.

(4) Embodiment in which the photosensitive layer is composed of two layers consisting of a physical phenomenon core layer and a silver halide emulsion layer.

(5) Embodiment in which the photosensitive layer contains three layers consisting of a polymer layer containing a multifunctional monomer and a multifunctional binder, a layer containing a silver halide and a reducing agent, and an oxygen blocking layer.

(6) Embodiment in which the photosensitive layer contains two layers consisting of a layer containing a novolak resin and naphthoquinone diazide, and a layer containing a silver halide.

(7) Embodiment in which the photosensitive layer contains an organic photoconductor.

(8) Embodiment in which the photosensitive layer contains two to three layers consisting of a laser light absorbing layer that is removed by irradiation with laser light, and a lipophilic layer and/or a hydrophilic layer.

(9) Embodiment in which the photosensitive layer contains a compound that generates acid by absorbing energy, a polymer compound having a functional group in its side chain that generates sulfonic acid or carboxylic acid, and a compound that imparts energy to an acid generator by absorbing visible light.

(10) Embodiment in which the photosensitive layer contains a quinone diazide compound and a novolak resin.

(11) Embodiment in which the photosensitive layer contains a compound that forms a crosslinked structure with itself or other molecules within the layer by being decomposed by light or ultraviolet rays, and an alkaline-soluble binder.

The present invention is most preferably applied to a heat mode type or photo mode type of laser-compatible planographic printing plate. The components within the photosensitive layer and thermosensitive layer in the image-forming layer can be selected as necessary. Preferable embodiments are indicated in (1) through (4) below.

(1) Embodiment in which the photosensitive layer contains two layers consisting of a layer containing a compound that generates radicals when irradiated with laser light, alkaline-soluble binder and multifunctional monomer or prepolymer, and an oxygen blocking layer.

(2) Embodiment in which the photosensitive layer contains a photopolymer type of photosensitive layer containing a photo-intensifying dye that at least has an absorption range over the wavelength range of 600 to 1300 nm, a monomer that contains an ethylenic double bond, and a photopolymerization initiator.

(3) Embodiment in which the photosensitive layer contains a positive type of photosensitive layer containing a photothermal conversion substance that at least has an absorption range within the range of 600 to 1300 nm and an alkaline-soluble resin.

(4) Embodiment in which the aforementioned positive photosensitive layer requires heat treatment in its production process.

The following provides an explanation of a photothermal conversion substance (a) (simply referred to as the photothermal conversion substance) having an absorption range within the range of 600 to 1300 nm that is a first component used in the positive photosensitive composition of the present invention. Although the photothermal conversion substance used in the present invention efficiently absorbs light within the wavelength range 650 to 1300 nm, it absorbs hardly any light in the ultraviolet region, is substantially not sensitized even if ultraviolet light is absorbed, and is a substance that does not have an action that allows a photosensitive composition to be denatured by weak ultraviolet rays like those contained in an incandescent lamp. Preferable examples of photothermal conversion substances (intensifying dyes) include cyanine dye, polymethin dye, squalirium dye, croconium dye, pyrylium dye, thiopyrylium dye. More Preferable examples include cyanine dye, polymethin dye, pyrylium dye, thiopyrylium dye and dyes having an N,N-diaryliminium backbone.

The ratio of these photothermal conversion substances used in the positive photosensitive composition is preferably 0.1 to 30% by weight and more preferably 1 to 20% by weight.

Next, an explanation is provided of an alkaline-soluble resin (b) that is a second component used in the present invention. Although examples of alkaline-soluble resins include novolak resins, rezol resins, polyvinyl phenol resins and copolymers of acrylic acid derivatives, novolak resins and polyvinyl phenol resins are preferable.

Examples of novolak resins include those in which at least one type of aromatic hydrocarbon such as phenol, m-cresol, o-cresol, p-cresol, 2,5-xylenol, 3,5-xylenol, resorcin, pyrogallol, bisphenol, bisphenol A, trisphenol, o-ethylphenol, m-ethyl phenol, p-ethyl phenol, propyl phenol, n-butyl phenol, t-butyl phenol, 1-naphthol or 2-naphthol is condensation polymerized with at least one type of aldehyde or ketone selected from the group consisting of aldehydes such as formaldehyde, acetoaldehyde, propionaldehyde, benzaldehyde and furfural, and ketones such as acetone, methyl ethyl ketone and methyl isobutyl ketone in the presence of an acidic catalyst.

Para-formaldehyde and para-aldehyde may also be used instead of formaldehyde and acetoaldehyde, respectively. The weight average molecular weight as polystyrene of the novolak resin used as determined by gel permeation chromatography (abbreviated as GPC) (weight average molecular weight as determined by GPC is hereinafter abbreviated as Mw) is preferably 1,000 to 15,000 and particularly preferably 1,500 to 10,000.

Examples of aromatic hydrocarbons of novolak resins more preferably include novolak resins in which at least one type of phenol selected from phenol, o-cresol, m-cresol, p-cresol, 2,5-xylenol, 3,5-xylenol, and resorcin is condensation polymerized with at least one type selected from aldehydes such as formaldehyde, acetoaldehyde and propionaldehyde.

Novolak resins that are condensation polymers of phenols in which the mixing ratio of m-cresol:p-cresol:2,5-xylenol:3,5-xylenol:resorcin as the molar ratio is 70-100:0-30:0-20:0-20:0-20, or phenols in which the mixing ratio of phenol:m-cresol:p-cresol is 10-100:0-60:0-40, and aldehyde are particularly preferable. Formaldehyde is especially preferable in the aldehyde.

Examples of polyvinyl phenol resins include polymers of one or two or more types of hydroxystyrenes such as o-hydroxystyrene and 2-(p-hydroxyphenyl)propylene. In addition, the polyvinyl phenol resin may be a resin in which a portion of the OH groups of the polyvinyl phenol are protected with a t-butoxycarbonyl group, pyranyl group or furanyl group and so forth. The Mw of the polyvinyl phenol resin is preferably 1,000 to 100,000 and particularly preferably 1,500 to 50,000.

Among the aforementioned resins, a novolak resin is particularly preferable. The usage ratio of these resins in the positive photosensitive composition used in the present invention in terms of a weight ratio is preferably 40 to 95% and particularly preferably 60 to 90%.

Next, the third component of the present invention in the form of a dissolution inhibitor (c), which decreases the rate of dissolution with respect to alkaline developing solutions of a mixture composed of the aforementioned photo-intensifying dye (a) and the aforementioned alkaline-soluble resin (b), may be added (which is simply to be referred to as the dissolution inhibitor).

Examples of dissolution inhibitors effectively used in the present invention include sulfonic esters, phosphoric esters, aromatic carboxylic esters, aromatic disulfones, carboxylic anhydrides, aromatic ketones, aromatic aldehydes, aromatic amines and aromatic ether compounds, and these may be used alone or as a mixture of two or more types.

The photosensitive composition used in the present invention is normally used by dissolving each of the aforementioned components in a suitable solvent. There are no particular limitations on the solvent provided it has adequate solubility with respect to the components used and imparts satisfactory film coating properties, examples of which include methyl cellosolve, ethyl cellosolve, methyl cellosolve acetate, ethyl cellosolve acetate and other cellosolve-based solvents, propylene glycol monomethyl ether and other propylene glycol-based solvents, methyl lactate and other ester-based solvents, cyclohexanone and other highly polar solvents, mixed solvents thereof, and solvents to which aromatic hydrocarbons have been added thereto. The usage ratio of solvent is normally within the range of about 1 to 20 times in terms of weight ratio with respect to the total amount of photosensitive composition.

Furthermore, the photosensitive composition of the present invention may also contain, within a range that does not impair its performance, various other additives such as dyes, pigments, coating improvers, development improvers, adhesion improvers, sensitivity improvers, lipid sensitizers and so forth.

Coating methods known in the prior art can be used for the coating method used when providing the photosensitive composition used in the present invention on the surface of the support, examples of which include rotary coating, wire bar coating, dip coating, air knife coating, roll coating, die coating, blade coating and curtain coating. Although the coated amount varies according to the application, an amount of, for example, 0.1 to 10.0 g/m$^2$ as the solid fraction is preferable. In addition, the drying temperature is 20 to 100° C. and preferably 40 to 80° C.

Examples of the support on which is provided a photosensitive layer using the photosensitive composition used in the present invention include aluminum, zinc, steel, copper and other metal plates, chrome, zinc, copper, nickel, aluminum, iron and other plated or deposited metal plates, paper, plastic film and glass plates, resin-coated paper, paper covered with aluminum and other foil, and hydrophilicly-treated plastic film. Among these, an aluminum plate is preferable. The use of an aluminum plate that has undergone pebbling treatment by electrolytic etching in aqueous hydrochloric acid or sulfuric acid or brush grinding, anodic oxidation treatment in a sulfuric acid solvent, and as necessary, surface treatment such as pore sealing treatment is more preferable for the support of the photosensitive planographic printing plate of the present invention.

A light source that generates light rays at 600 to 1300 nm, such as a near infrared laser of 650 to 1200 nm in particular, is preferable for the light source of the light used to expose the planographic printing plate provided with the photosensitive layer of the present invention, examples of which include a ruby laser, YAG laser, semiconductor laser and LED, of which a compact, long-life semiconductor laser or YAG laser is particularly preferable. As a result of using these light sources, a printing plate can be obtained on which an image is formed by developing with a developing solution following scanning and exposure.

An alkaline developing solution is particularly preferable for the aforementioned developing solution. Examples of developing solutions include aqueous solutions of sodium hydroxide, potassium hydroxide, sodium carbonate, potassium carbonate, sodium metasilicate, potassium metasilicate and other alkaline metal salts. The concentration of the alkaline metal salt is preferably 0.1 to 20% by weight. In addition, an anionic surfactant, amphoteric surfactant or alcohol or other organic solvent can be added as necessary to the developing solution.

The present positive photosensitive composition can be obtained by contacting and laminating a slip sheet containing moisture onto the surface of a photosensitive layer formed by the aforementioned method followed by performing heat treatment. In this heat treatment method, water vapor is generated by the slip sheet that contains moisture during heating of the planographic printing plate and slip sheet laminate, and as a result of this water vapor being dispersed in the binder component of the surface of the photosensitive layer, hydrogen bonding and orientation occur and an alkaline-resistant layer is formed on the surface layer only. As a result, a planographic printing plate can be obtained having satisfactory sensitivity and superior chemical resistance, printing resistance and storage characteristics.

If this type of heat treatment method is used, since the slip sheet can typically be used as a protective material for a photosensitive layer for workability and during transport of planographic printing plates, and can be treated in a stacked or coiled shape, a high level of performance can be achieved without causing increases in the work space, work steps or costs.

EXAMPLES

Although the following provides a more detailed explanation of the present invention through its examples, the present invention is not restricted by these examples provided they do not deviate from its gist.

In addition, the "Production Process Evaluation Tests" and "Automatic Plate Feeding Evaluation Tests" on the slip sheet were carried out in accordance with the following criteria.

Production Process Evaluation Test 1—Evaluation of Adhesion by Static Electricity After charging a slip sheet at a line speed of 32 m/min and applied voltage of −28 kV using a corona discharge type of charging device (trade name: PD Type Electrode PD-1470, Kasuga Japan) and attaching to the image-forming surface of a planographic printing plate, it was cut to a size of 1000×800 mm with a rotary cutter. At this time, whether or not the state in which the slip sheet was adhered to the image-forming surface is maintained for 13 seconds during transport on a belt conveyor was evaluated visually.

(Evaluation Criteria)

○: 0 of 100 slip sheets separated from the image-forming surface

Δ: 1-2 of 100 slip sheets separated from the image-forming surface

X: 3 or more of 100 slip sheets separated from the image-forming surface

Production Process Evaluation Test 2—Evaluation of Charge Attenuation Characteristics The state in which the slip sheet was adhered to the image-forming surface of a planographic printing plate was evaluated after allowing to stand for 1 hour following Production Process Evaluation Test 1 by measuring the peel strength between the slip sheet and image-forming surface using a spring balance (weighing capacity: 2 kg).

(Evaluation Criteria)

○: Peel strength of 10 g or less

Δ: Peel strength of 11 g to 500 g

X: Peel strength of 501 g or more

Production Process Evaluation Test 3×Evaluation of Sticking During Heat Treatment After performing heat treatment on a laminate consisting of 1000 layers of planographic printing plates, the laminate was allowed to stand for 2 days and one of the bottom most plate was taken out and developed at a liquid temperature of 30° C. and transport rate of 90 cm/min using a developing machine (trade name: MT850X, Mitsubishi Chemical) and developing solution (trade name: DR6, Mitsubishi Chemical). At this time, transfer (defects) caused by blocking of the slip sheet that occurred over the entire surface of the image-forming surface of the planographic printing plate was evaluated visually.

(Evaluation Criteria)

○: No transfer

○Δ: Transfer at 1 to 3 locations

Δ: Transfer at 4 to 20 locations

X: Transfer at 21 or more locations

Production Process Evaluation Test 4—Evaluation of Sticking During Heat Treatment 30 laminates of slip sheets that remained adhered to the image-forming surface of the planographic printing plate after carrying out Production Process Evaluation Test 1 were layered after cutting into 40 mm squares and then subjected to a load of 1 ton at a temperature of 70° C. for 30 minutes. At this time, whether or not the image-forming surface of the planographic printing plate transferred to the slip sheet was evaluated visually.

(Evaluation Criteria)

○: No transfer confirmed

○Δ: Hardly any transfer confirmed with the naked eye but able to be confirmed with a magnifying glass Δ: Transfer slightly visible with the naked eye X: Transfer easily visible with the naked eye Automatic Plate Feeding Evaluation Test 1—Evaluation of Separation Automatic plate feeding was performed on a planographic printing plate laminate consisting of 100 layers measuring 1000×800 mm using a plate setter (trade name: MA-L8000, Dainippon Screen Mfg.). When the planographic printing plate support (3) was lifted up with the suction member (11) of the automatic plate feeding mechanism, and said planographic printing plate was lifted up from the slip sheet adhered to the planographic printing plate support (3) and image-forming surface (2) of the planographic printing plate while in this state, visual observation was made as to whether or not the slip sheet easily separated from the planographic printing plate.

(Evaluation Criteria)

○: 0 of 100 slip sheets did not separate

Δ: 1-2 of 100 slip sheets did not separate

X: 3 or more of 100 slip sheets did not separate

Automatic Plate Feeding Evaluation Test 2—Evaluation of Discharge Characteristics Automatic plate feeding was carried out in the same manner as Automatic Plate Feeding Evaluation Test 1 on a planographic printing plate laminate consisting of 100 layers measuring 1000×800 mm using a plate setter (trade name: MA-L8000, Dainippon Screen Mfg.). After suctioning a slip sheet remaining on the suction member (11) of an automatic plate feeding mechanism and separating from the planographic printing plate support (3), the end of the slip sheet was transported between slip sheet discharge rolls (14) adhered above and below with a suction member for slip sheet discharge (13) followed by visual evaluation as to whether the slip sheet was able to be discharged outside the automatic plate feeder.

(Evaluation Criteria)

○: 0 of 100 slip sheets unable to be discharged

Δ: 1-2 of 100 slip sheets unable to be discharged

ΔX: 3 of 100 slip sheets unable to be discharged

X: 4 or more of 100 slip sheets unable to be discharged

Automatic Plate Feeding Evaluation Test 3—Evaluation of Storage Characteristics

The number of slip sheets able to be stored within a slip sheet discharge storage box (15) after being discharged with an automatic plate feeder (trade name: LOTEM800V, Creo Inc.) was measured.

(Evaluation Criteria)

○: 40 sheets or more

Δ: 30-39 sheets

X: 29 sheets or less

Production of Planographic Printing Plate

1. Production of Aluminum Plate (Support)

After degreasing an aluminum plate having a thickness of 0.24 mm and width of 1000 mm (material: 1050, refinement: H16) for 1 minute at a temperature of 60° C. in 5% by weight aqueous sodium hydroxide solution, it was subjected to electrolytic etching under conditions of a temperature of 25° C., current density of 60 $A/dm^2$and treatment time of 30 seconds in 0.5 mol/l aqueous nitric acid solution. Next, anodic oxidation treatment was carried out in 5% by weight aqueous sodium hydroxide solution under conditions of a temperature of 60° C., current density of 3 $A/dm^2$ and treatment time of 1 minute. Moreover, this was then subjected to hot water sealing treatment for 20 seconds using hot water at 80° C. to produce an aluminum plate of a planographic printing plate support.

2. Preparation of Photosensitive Solution

A photosensitive solution composed of the components indicated below was prepared.

[Composition of Photosensitive Solution]

| | | |
|---|---|---|
| Photo-intensifying dye: NK4432 (Hayashibara Biochemical Labs) | | 0.04 g |
| Alkaline-soluble resin: m-cresol/p-cresol/ Phenol novolak resin (molar ratio: 3:2:5) | | 1.0 g |
| Dissolution inhibitor 1: Crystal biolactone | | 0.1 g |
| Dissolution inhibitor 2: Ester condensation product of novolak resin and 5-hydroxy-6-diacetylmethylidenehydrazino-naphthalene sulfonate | | 0.1 g |
| Additive 1: Scimel 300 (Mitsui Sci-Tech) | | 0.01 g |
| Additive 2: Cyclohexanone-1,2-dicarboxylic acid | | 0.05 g |
| Additive 3: Tetraoleic polyoxylene ethylene Sorbitol | | 0.04 g |
| Solvents: | Methyl cellosolve | 7.2 g |
| | Ethyl cellosolve | 1.8 g |

3. Coating of Photosensitive Solution

The photosensitive solution prepared as described above was coated with a roll coater onto the surface of the aforementioned aluminum plate produced in the form of a planographic printing plate support followed by drying for a drying time of 30 seconds in a first drying oven at 50° C. and then drying for a drying time of 30 seconds in a second drying oven at 90° C. to provide a photosensitive layer (image-forming layer) having a film thickness of 20 $mg/dm^2$.

4. Adhesion of Slip Sheet Lamination and Aging

A slip sheet (1) for a planographic printing plate that had been charged at an applied voltage of −28 kv with a corona discharge type charging device was adhered to the surface of an image-forming surface (2) and cut to a length of 800 mm with a rotary cutter (6) followed by laminating 1000 sheets onto a resin pallet provided with a heat insulating material on its upper portion to obtain a planographic printing plate laminate (8). Next, the lateral surfaces of the aforementioned planographic printing plate laminate (8) on the side were covered with a polyethylene sheet having a thickness of 100 μm in which paper and polyethylene deposited with aluminum on its surface were laminated followed by adhesion and sealing to prevent entrance of air. Next, the upper portion of this planographic printing plate laminate (8) was also heat-insulated with a heat insulating material followed by aging the laminate for 32 hours by placing in a heat treatment chamber at a temperature of 60° C. to obtain a planographic printing plate.

Production of Slip Sheet

EXAMPLE 1

Needle bleached kraft pulp (NBKP), leaf bleached kraft pulp (LBKP) were blended at a weight ratio of 3:7 and refined to a degree of beating of 390 ml C.S.F. to prepare a pulp slurry. 0.2 parts by weight of a wet paper strength enhancing agent (trade name: WS-547, Nippon PMC), 0.4 parts by weight of a dry paper strength enhancing agent (trade name: Polyacron ST-13, Seiko Chemical), 0.2 parts by weight of a sizing agent (trade name: Sizepine E, Arakawa Chemical Industries) and 3.5 parts by weight of liquid aluminum sulfate were blended into this pulp slurry with respect to 100 parts by weight of pulp to prepare a raw material for papermaking.

Two sets of sizing presses were installed in the papermaking machine when this raw material was manufactured into paper using a Fourdrinier machine. An aqueous surface treatment agent solution of formula A indicated below was coated onto the surface with the first stage sizing press, an aqueous surface treatment agent solution of formula B indicated below was coated onto the surface using the second stage sizing press and the thickness was adjusted with a calender roll to produce a slip sheet for a planographic printing plate having a basis weight of 45.2 g/m$^2$ and thickness of 0.052 mm.

| Formulas of Aqueous Surface Treatment Agent Solutions Used in Sizing Presses | |
|---|---|
| Formula A: | |
| Surface paper strength enhancing agent (trade name: Polymerset 305, Arakawa Chemical Industries | 3.0 wt % |
| Surface treatment agent (saponification product of alkenyl dicarboxylic acid) | 0.4 wt % |
| Formula B: | |
| Surface paper strength enhancing agent: (same as above) | 3.0 wt % |
| Surface treatment agent (same as above) | 3.0 wt % |

The resulting slip sheets were applied to the aforementioned planographic printing plate followed by performing the Production Process Evaluation Tests and Automatic Plate Feeding Evaluation Tests. Those results are shown in Table 1.

EXAMPLE 2

A slip sheet for a planographic printing plate was produced having a basis weight of 44.9 g/m$^2$ and thickness of 0.054 mm by using the same method as Example 1 with the exception of using only the first stage of a sizing press installed in a Fourdrinier machine.

The resulting slip sheet was applied to the aforementioned planographic printing plate and subjected to the Production Process Evaluation Tests and Automatic Plate Feeding Evaluation Tests. Those results are shown in Table 1.

EXAMPLE 3

A slip sheet for a planographic printing plate was produced having a basis weight of 55.8 g/m$^2$ and thickness of 0.068 mm by using the same method as Example 1 with the exception of using only the first stage of a sizing press installed in a Fourdrinier machine and changing the formula of the aqueous surface treatment agent solution used therein to the aqueous surface treatment agent solution of formula C indicated below. Furthermore, sodium sulfate was used as an antistatic agent.

The resulting slip sheet was applied to the aforementioned planographic printing plate and subjected to the Production Process Evaluation Tests and Automatic Plate Feeding Evaluation Tests. Those results are shown in Table 1.

| Formula C: | |
|---|---|
| Surface paper strength enhancing agent: (same as above) | 3.0 wt % |
| Surface treatment agent (same as above) | 0.8 wt % |
| Antistatic agent | 2.0 wt % |

EXAMPLE 4

A slip sheet for a planographic printing plate was produced having a basis weight of 35.1 g/m$^2$ and thickness of 0.042 mm by using the same method as Example 2.

The resulting slip sheet was applied to the aforementioned planographic printing plate and subjected to the Production Process Evaluation Tests and Automatic Plate Feeding Evaluation Tests. Those results are shown in Table 1.

EXAMPLE 5

A slip sheet for a planographic printing plate was produced having a basis weight of 39.9 g/m$^2$ and thickness of 0.050 mm by using the same method as Example 1 with the exception of using only the first stage of a sizing press installed in a Fourdrinier machine and using the aqueous surface treatment agent solution of formula D indicated below.

| Formula D: | |
|---|---|
| Surface paper strength enhancing agent: (same as above) | 6.0 wt % |
| Surface treatment agent (styrene methacrylate Ester-silicon copolymer, trade name: Polysol ROY-6312, Showa High Polymer) | 3.4 wt % |

The resulting slip sheet was applied to the aforementioned planographic printing plate and subjected to the Production Process Evaluation Tests and Automatic Plate Feeding Evaluation Tests. Those results are shown in Table 1.

EXAMPLE 6

A slip sheet for a planographic printing plate was produced having a basis weight of 40.0 g/m$^2$ and thickness of 0.049 mm by using the same method as Example 1 with the exception of using only the first stage of a sizing press installed in a Fourdrinier machine and using the aqueous surface treatment agent solution of formula E indicated below.

| Formula E: | |
|---|---|
| Surface paper strength enhancing agent: (same as above) | 6.0 wt % |
| Surface treatment agent (cationic polyethylene Emulsion, trade name: Cationic PZ-5, Nissin Kagaku Kenkyusho) | 3.4 wt % |

The resulting slip sheet was applied to the aforementioned planographic printing plate and subjected to the Production Process Evaluation Tests and Automatic Plate Feeding Evaluation Tests. Those results are shown in Table 1.

EXAMPLE 7

A slip sheet for a planographic printing plate was produced in the same manner as Example 1 with the exception of coating an aqueous surface treatment agent solution with a two-stage sizing press followed by reducing the pressure of the calender roll.

The resulting slip sheet was applied to the aforementioned planographic printing plate and subjected to the Production Process Evaluation Tests and Automatic Plate Feeding Evaluation Tests. Those results are shown in Table 1.

Comparative Example 1

A commercially available slip sheet (made by Company A) for a planographic printing plate was applied to the aforementioned planographic printing plate and subjected to the Production Process Evaluation Tests and Automatic Plate Feeding Evaluation Tests. Those results are shown in Table 2.

Comparative Example 2

A commercially available slip sheet (made by Company B, TIM, blended slip sheet containing 15% polyethylene and 85% natural pulp) for a planographic printing plate was applied to the aforementioned planographic printing plate and subjected to the Production Process Evaluation Tests and Automatic Plate Feeding Evaluation Tests. Those results are shown in Table 2.

Comparative Example 3

A commercially available slip sheet for a planographic printing plate manufactured by internally adding a rosin-based sizing agent to a pulp slurry having kraft pulp as the raw material so that the basis weight was 30.1 g/m$^2$ (made by Company C) was applied to the aforementioned planographic printing plate and subjected to the Production Process Evaluation Tests and Automatic Plate Feeding Evaluation Tests. Those results are shown in Table 2.

Comparative Example 4

A pulp slurry having kraft pulp as the raw material was manufactured into the paper sheet which is the basis weight of 33.0 g /m$^2$ using a Fourdrinier machine, and then laminated with a 10 μm film composed of low-density polyethylene (LDPE) which was made by the high pressure method. This laminated layer was then subjected to the Production Process Evaluation Tests and Automatic Plate Feeding Evaluation Tests using the surface in contact with the image-forming surface of the planographic printing plate (slip sheet surface). Those results are shown in Table 2.

TABLE 1

| | | Ex. 1 | Ex. 2 | Ex. 3 | Ex. 4 | Ex. 5 | Ex. 6 | Ex. 7 |
|---|---|---|---|---|---|---|---|---|
| Basis weight | g/m$^2$ | 45.2 | 44.9 | 55.8 | 35.1 | 39.9 | 40.0 | 45.1 |
| Thickness | mm | 0.052 | 0.054 | 0.068 | 0.042 | 0.050 | 0.049 | 0.059 |
| Density | g/cm$^3$ | 0.87 | 0.83 | 0.82 | 0.84 | 0.80 | 0.82 | 0.76 |
| Surface strength | No. A | 18 | 18 | 18 | 18 | 20 | 20 | 18 |
| Surface electrical resistance | Ω | $1.94 \times 10^{11}$ | $5.29 \times 10^{11}$ | $1.63 \times 10^{8}$ | $3.78 \times 10^{11}$ | $1.60 \times 10^{11}$ | $1.48 \times 10^{11}$ | $2.90 \times 10^{11}$ |
| Clark stiffness | — | 28.8 | 29.6 | 46.0 | 20.7 | 25.5 | 25.25 | Not measured |
| Beck's smoothness | Seconds | 130 | 90 | 60 | 70 | 70 | 70 | 35 |
| Moisture content | wt % | 6.6 | 6.6 | 6.8 | 6.7 | 6.7 | 6.7 | Not measured |
| Coefficient of static friction (top/top) | — | 0.19 | 0.31 | 0.24 | 0.27 | 0.24 | 0.16 | 0.22 |
| Coefficient of static friction (top/back) | — | 0.17 | 0.25 | 0.27 | Not measured | 0.24 | 0.15 | Not measured |
| Coefficient of dynamic friction (top/top) | — | 0.16 | 0.28 | 0.23 | 0.23 | 0.20 | 0.14 | 0.20 |
| Coefficient of dynamic friction (slip sheet surface/plate surface) | — | 0.21 | 0.23 | 0.22 | Not measured | Not measured | Not measured | Not measured |

TABLE 1-continued

| | | Ex. 1 | Ex. 2 | Ex. 3 | Ex. 4 | Ex. 5 | Ex. 6 | Ex. 7 |
|---|---|---|---|---|---|---|---|---|
| Production Process Evaluation 1 | Slip sheet adhesion | ○ | ○ | Δ | ○ | ○ | ○ | ○ |
| Production Process Evaluation 2 | Slippage | ○ | ○ | ○ | ○ | ○ | ○ | — |
| Production Process Evaluation 3 | Heat treatment compatibility | ○ | ○ | ○Δ | ○ | ○ | ○ | ○ |
| Production Process Evaluation 4 | Press transfer | ○ | ○ | ○Δ | ○Δ | ○ | ○ | ○ |
| Automatic Plate Feeding Evaluation 1 | Separation | ○ | ○ | ○ | ○ | ○ | ○ | ○ |
| Automatic Plate Feeding Evaluation 2 | Discharge | ○ | ○ | ○ | Δ | ○ | ○ | ○ |
| Automatic Plate Feeding Evaluation 3 | Storage | ○ | ○ | Δ | ○ | ○ | ○ | ○ |

TABLE 2

| | | Comp. Ex. 1 | Comp. Ex. 2 | Comp. Ex. 3 | Comp. Ex. 4 |
|---|---|---|---|---|---|
| Basis weight | $g/m^2$ | 52.2 | 34.9 | 30.1 | 33.0 |
| Thickness | mm | 0.075 | 0.050 | 0.042 | Not measured |
| Density | $g/cm^3$ | 0.70 | 0.70 | 0.72 | Not measured |
| Surface strength | No. A | 14 | 11 | 14 | 2 |
| Surface electrical resistance | Ω | $8.2 \times 10^{10}$ | $8.47 \times 10^{11}$ | $2.51 \times 10^{11}$ | $2.3 \times 10^{14}$ |
| Clark stiffness | — | 57 | 19 | 9.9 | 9.9 |
| Beck's smoothness | Seconds | 30 | 40 | 40 | 400 |
| Moisture content | wt % | 7.2 | 5.0 | 4.7 | 6.4 |
| Coefficient of static friction (top/top) | — | 0.49 | 0.39 | 0.43 | 0.42 |
| Coefficient of static friction (top/back) | — | 0.35 | 0.41 | 0.33 | Not measured |
| Coefficient of dynamic friction (top/top) | — | 0.46 | 0.35 | 0.36 | Not measured |
| Production Process Evaluation 1 | Slip sheet adhesion | ○ | ○ | ○ | ○ |
| Production Process Evaluation 2 | Slippage | ○ | Δ | X | X |
| Production Process Evaluation 3 | Heat treatment compatibility | X | X | X | ○ |
| Production Process Evaluation 4 | Press transfer | X | X | X | ○ |
| Automatic Plate Feeding Evaluation 1 | Separation | ○ | Δ | X | X |
| Automatic Plate Feeding Evaluation 2 | Discharge | ○ | ΔX | X | X |
| Automatic Plate Feeding Evaluation 3 | Storage | X | ○ | ○ | ○ |

INDUSTRIAL APPLICABILITY

The slip sheet of the present invention, in the production process of a planographic printing plate, adheres to the image-forming surface of the planographic printing plate as a result of being suitably charged, and following lamination, enables the charge to dissipate rapidly, and in an automatic plate feeder, has satisfactory separation, discharge characteristics and storage characteristics. In addition, sticking between the slip sheet and image-forming surface can simultaneously be prevented even during heat treatment. This slip sheet is particularly effective for planographic printing plates of the heat mode type and photon mode type on which images are formed by exposure to laser light.

What is claimed is:

1. A slip sheet for a planographic printing plate that protects the planographic printing plate by having pulp fibers as a main constituent and a surface that contacts an image-forming surface of the planographic printing plate; and is physically separable from the planographic printing plate; wherein, the surface strength of the surface of the slip sheet is 15 or more and less than or equal to 26, a surface treatment agent containing a saponification product of an alkenyl dicarboxylic acid is coated onto the surface for preventing blocking between the image-forming surface and the slip sheet, and the surface resistance value of the surface of the slip sheet is $1.0\times10^7$ to $1.0\times10^{12}$ Ω.

2. A slip sheet for a planographic printing plate that protects the planographic printing plate by having pulp fibers as a main constituent and a surface that contacts an image-forming surface of the planographic printing plate; and is physically separable from the planographic printing plate; wherein, the Clark stiffness of the slip sheet is 20 to 50, the basis weight of the slip sheet is 40 to 60 g/m$^2$, a surface treatment agent containing a saponification product of an alkenyl dicarboxylic acid is coated onto the surface for preventing blocking between the image-forming surface and the slip sheet, and the surface resistance value of the surface of the slip sheet is $1.0\times10^7$ to $1.0\times10^{12}$ Ω.

3. A slip sheet for a planographic printing plate according to claim 2 that protects the planographic printing plate by having pulp fibers as a main constituent and a surface that contacts an image-forming surface of the planographic printing plate; and is physically separable from the planographic printing plate; wherein, the coefficient of static friction between the surfaces is 0.35 or less.

4. A slip sheet for a planographic printing plate according to claim 1 or 2 wherein, the Beck's smoothness of the surface of the slip sheet that contacts the image forming surface of the planographic printing plate is 30 seconds or more.

5. A slip sheet for a planographic printing plate according to claim 1 or 2 wherein, the Beck's smoothness of the surface of the slip sheet that contacts the image forming surface of the planographic printing plate is from 20 seconds to less than 60 seconds.

6. A slip sheet for a planographic printing plate according to claim 2 wherein, the surface strength of the surface of the slip sheet is 15 or more.

7. A slip sheet for a planographic printing plate according to claim 1 wherein, the Clark stiffness of the slip sheet is from 20 to 50.

8. A slip sheet for a planographic printing plate according to claim 2 that protects the planographic printing plate by having pulp fibers as a main constituent; a top surface that contacts an image-forming surface of the planographic printing plate; and a back surface that does not contact the image-forming surface; and is physically separable from the planographic printing plate; wherein, the coefficient of static friction between the top surface and the back surface is 0.32 or less.

9. A slip sheet for a planographic printing plate according to claim 2 that protects the planographic printing plate by having pulp fibers as a main constituent and a surface that contacts an image-forming surface of the planographic printing plate; and is physically separable from the planographic printing plate; wherein, the coefficient of dynamic friction between corresponding surfaces of the slip sheet is 0.32 or less.

10. A slip sheet for a planographic printing plate according to claim 2 that protects the planographic printing plate by having pulp fibers as a main constituent and a surface that contacts an image-forming surface of the planographic printing plate; and is physically separable from the planographic printing plate; wherein, the coefficient of dynamic friction between the image-forming surface of the planographic printing plate and the surface of the slip sheet is 0.27 or less.

11. A slip sheet for a planographic printing plate according to claim 1 or 2 wherein, the moisture content of the slip sheet is 1 to 10% by weight.

12. A slip sheet for a planographic printing plate according to claim 1 or 2 that protects the planographic printing plate by having a surface that contacts an image-forming surface of the planographic printing plate and is separable from the planographic printing plate; wherein, a saponification product of an alkenyl dicarboxylic anhydride is added to a paper raw material for the slip sheet.

13. A protected planographic printing plate comprising a planographic printing plate, and a slip sheet according to claim 1 or 2, wherein:

the planographic printing plate comprises an image-forming layer having an image-forming surface, and the surface of the slip sheet contacts the image-forming surface of the image-forming layer.

14. A protected planographic printing plate according to claim 13 wherein, the image-forming surface is a photosensitive surface for exposure to laser light.

15. A planographic printing plate according to claim 14 wherein, the photosensitive layer for exposure to laser light is a positive photosensitive layer containing a photothermal conversion substance having an absorption range within the range of 600 to 1300 nm and an alkaline-soluble resin.

16. A laminate of a planographic printing plate composed by alternately laminating a slip sheet according to claim 1 or 2 and a planographic printing plate.

17. A slip sheet for a planographic printing plate according to claim 1 or 2, wherein the surface treatment agent further comprises an acrylic polymer.

18. A slip sheet for a planographic printing plate according to claim 12, wherein an acrylic polymer is further added to the paper raw material.

19. A slip sheet for a planographic printing plate according to claim 12, wherein the surface treatment agent further comprises an acrylic polymer and an acrylic polymer is further added to the paper raw material.

20. A slip sheet for a planographic printing plate according to claim 18 or 19 wherein, the acrylic polymer is a polymer or copolymer of an acrylic monomer selected from the group consisting of (meth)acrylic acid, (meth)acrylic esters, and (meth)acrylic amides.

21. The protected planographic printing plate according to claim 13 wherein the photosensitive layer comprises an oxygen blocking layer.

22. A slip sheet for a planographic printing plate according to claim 17 wherein, the acrylic polymer is a polymer or copolymer of an acrylic monomer selected from the group consisting of (meth)acrylic acid, (meth)acrylic esters, and (meth)acrylic amides.

* * * * *